（12） United States Patent
Tseng et al.

(10) Patent No.: US 8,779,806 B2
(45) Date of Patent: Jul. 15, 2014

(54) CIRCUIT AND METHOD FOR IMPROVING NOISE IMMUNITY OF A SINGLE-END LEVEL SHIFTER IN A FLOATING GATE DRIVER

(71) Applicant: Richtek Technology Corporation, Chupei (TW)

(72) Inventors: Pei-Kai Tseng, Keelung (TW); Chien-Fu Tang, Hsinchu (TW); Isaac Y. Chen, Jubei (TW)

(73) Assignee: Richtek Technology Corp., Chupei, Hsinchu (TW)

( * ) Notice: Subject to any disclaimer, the term of this patent is extended or adjusted under 35 U.S.C. 154(b) by 0 days.

(21) Appl. No.: 13/761,825

(22) Filed: Feb. 7, 2013

(65) Prior Publication Data

US 2013/0207704 A1   Aug. 15, 2013

(30) Foreign Application Priority Data

Feb. 10, 2012   (TW) .............................. 101104393 A

(51) Int. Cl.
*H03K 3/00*   (2006.01)
*H03L 5/00*   (2006.01)

(52) U.S. Cl.
USPC ............. 327/108; 327/112; 327/333; 326/83; 326/80; 363/132

(58) Field of Classification Search
USPC ......... 327/108–112, 333, 427, 434, 437, 194, 327/378–385, 18, 20, 170–175; 326/80–87, 326/21–27, 31–34, 62–64; 363/132, 98, 17, 363/131, 55, 56.01, 56.02, 56.03, 56.04, 363/56.05, 40, 41, 97; 323/223–226, 323/282–287
See application file for complete search history.

(56) References Cited

U.S. PATENT DOCUMENTS

| 6,037,720 | A  | * | 3/2000 | Wong et al. | .................. 315/291 |
| 6,664,822 | B2 | * | 12/2003 | Watabe | ........................ 327/108 |
| 7,236,020 | B1 | * | 6/2007 | Virgil | ............................. 327/108 |
| 2005/0134533 | A1 | * | 6/2005 | Sasada et al. | ................. 345/60 |
| 2005/0144539 | A1 | * | 6/2005 | Orita | ............................. 714/48 |
| 2008/0049471 | A1 | * | 2/2008 | Ribarich | ....................... 363/80 |

* cited by examiner

*Primary Examiner* — Lincoln Donovan
*Assistant Examiner* — Thomas Skibinski
(74) *Attorney, Agent, or Firm* — Muncy, Geissler, Olds & Lowe, P.C.

(57) ABSTRACT

A floating gate driver uses a single-end level shifter to translate a set signal and a reset signal induced by a rising edge and a falling edge of a switch signal to a common output terminal to generate an output voltage for a bistable circuit to generate a level shifted switch signal. Under control of a well transient detect signal asserted by detecting noise in the output voltage, a masking circuit between the single-end level shifter and the bistable circuit masks noise in the output voltage. This configuration has lower area penalty and better noise immunity.

20 Claims, 7 Drawing Sheets

CIRCUIT AND METHOD FOR IMPROVING NOISE IMMUNITY OF A SINGLE-END LEVEL SHIFTER IN A FLOATING GATE DRIVER

FIELD OF THE INVENTION

The present invention is related generally to a floating gate driver and, more particularly, to a circuit and a method for improving noise immunity of a single-end level shifter in a floating gate driver.

BACKGROUND OF THE INVENTION

The high voltage integrated circuit (HVIC) is necessary for high voltage applications, such as motor, ballast, two inductor one capacitor (LLC), and cold cathode fluorescent lamp (CCFL). For example, referring to FIG. 1, a high-side power transistor T1 and a low-side power transistor T2 of a half H-bridge circuit are controlled by gate control signals UG and LG provided by a controller IC 10, respectively. The gate control signals UG and LG are generated responsive to non-overlapping switch signals HIN and LIN, respectively. The direct-current (DC) input voltage VIN for the half H-bridge circuit may be up to 300-600 V or higher. In order to reduce the number of high-voltage circuit components used in the controller IC 10 and lower the voltage to which the high-side circuit will be subjected, the high-side circuit is formed in an ultra-high-voltage floating well 12, which is electrically coupled to the switching node LX of the half H-bridge circuit, and the voltage VLX of the switching node LX is used as the reference potential of the high-side circuit. The switch signals HIN and LIN are referenced to a low-voltage logic signal generated at the ground terminal GND. Then, the switch signal HIN is shifted to a higher level to generate the gate control signal UG. As the reference potential of the high-side circuit is not the voltage at the ground terminal GND but the voltage VLX at the switching node LX, the foregoing structure is known as a floating gate driver.

To shift the level of the switch signal HIN, a pulse generator 14 detects the rising edge and the falling edge of the switch signal HIN to trigger a set signal Set and a reset signal Reset, respectively, both of which are short-pulse signals, and a level shifter 16 translates the set signal Set and the reset signal Reset into the set input signal S and the reset input signal R of an SR flip-flop 18 to turn on and turn off the switch signal Q in reference to the voltage VLX. Therefore, the switch signals Q and HIN have the same logic state but are at different voltage levels. In the level shifter 16, the input transistors M1 and M2 are configured to transmit the set signal Set and the reset signal Reset to the output terminals AA and BB, respectively, and resistors R1 and R2 serve as loads of the input transistors M1 and M2, respectively. With the output terminals AA and BB being connected to the power input terminal Vb via the resistors R1 and R2, respectively, the input transistors M1 and M2 must be high-voltage transistors, the circuit design of which, therefore, entails a compromise between chip area and breakdown voltages. The input transistors M1 and M2 require large area if formed outside the ultra-high-voltage floating well 12, and may cause significant cross talk issue if formed in the ultra-high-voltage floating well 12, as a result of their proximity to each other.

U.S. Pat. No. 7,236,020 uses a single-end level shifter instead to translate the set signal Set and the reset signal Reset, and the translated signals are output from a same output terminal of the single-end level shifter to a D flip-flop in order to generate a level-shifted switch signal. Since the single-end level shifter includes only one input transistor, the circuit area of the level shifter can be significantly reduced, and cross talk between the conventionally required two input transistors is eliminated. Nevertheless, the single-end level shifter is disadvantaged by low noise immunity. For example, referring back to FIG. 1, the bootstrap capacitor Cb coupled between the power input terminal Vb and the switching node LX tends to introduce transient variation of the voltage VLX into the supply voltage Vb, and transient variation of the voltage Vb will in turn charge or discharge the parasitic capacitance Cp1 of the input transistor M1, thus generating noise at the output terminal AA. Since the single-end level shifter outputs the translated set signal Set and the translated reset signal Reset through the common output terminal AA, the aforesaid noise may lead to erroneous action of the D flip-flop or even cause the power transistors T1 and T2 to be turned on at a same time. Should the latter occur, the high-voltage DC power supply VIN will be directly short to the ground terminal GND.

Therefore, it is desired a circuit and a method for improving noise immunity of a single-end level shifter in a floating gate driver.

SUMMARY OF THE INVENTION

An objective of the present invention is to provide a circuit and a method for improving noise immunity of a single-end level shifter.

Another objective of the present invention is to provide a floating gate driver having a single-end level shifter.

According to the present invention, in a floating gate driver having a single-end level shifter, the output voltage of the single-end level shifter is detected to assert a well transient detect signal, and under control of the well transient detect signal, noise in the output voltage is masked to increase the robustness of the single-end level shifter.

In one embodiment, a well transient detector is used to detect the output voltage of the single-end level shifter to assert the well transient detect signal.

In one embodiment, a masking circuit is used to mask noise in the output voltage of the single-end level shifter.

The present invention not only has the lower area penalty of a single-end level shifter, but also improves noise immunity of the single-end level shifter.

BRIEF DESCRIPTION OF THE DRAWINGS

These and other objectives, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
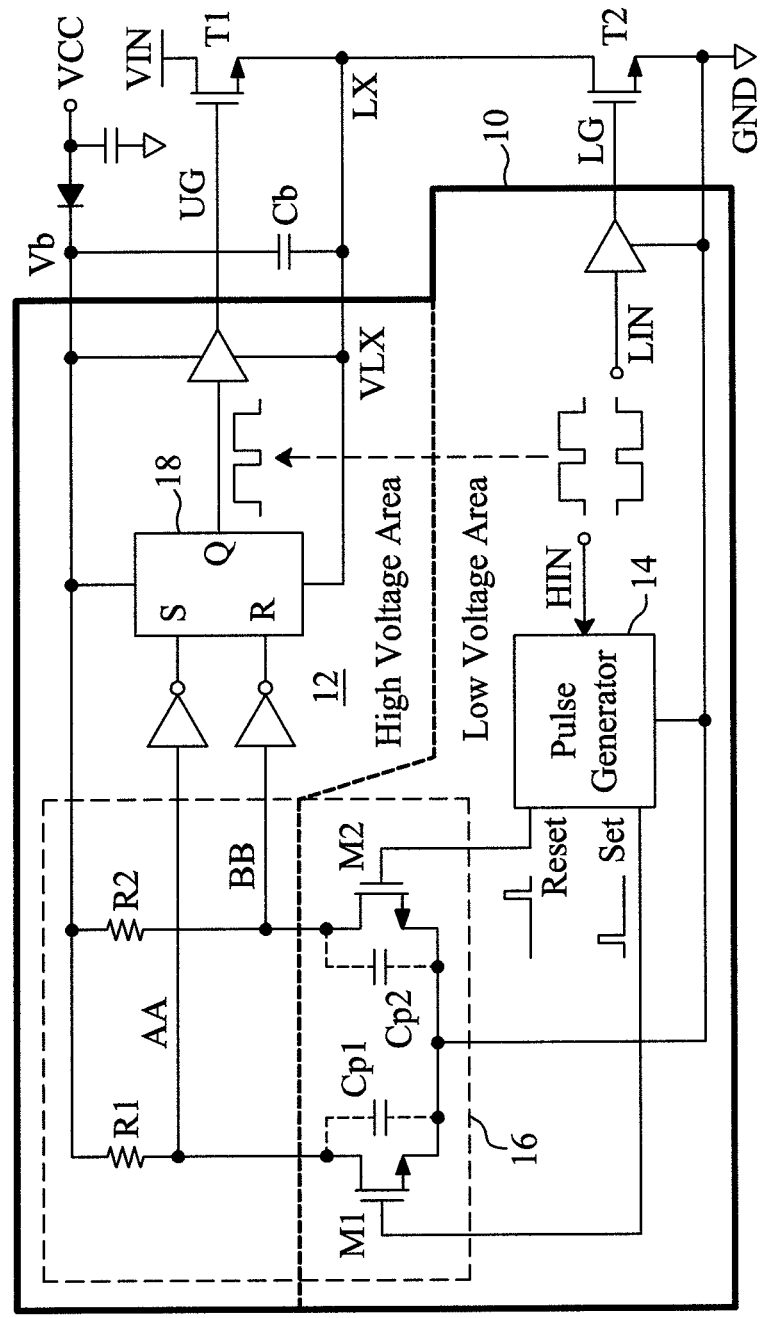
FIG. 1 is a circuit diagram of a conventional floating gate driver.
Figure 2:
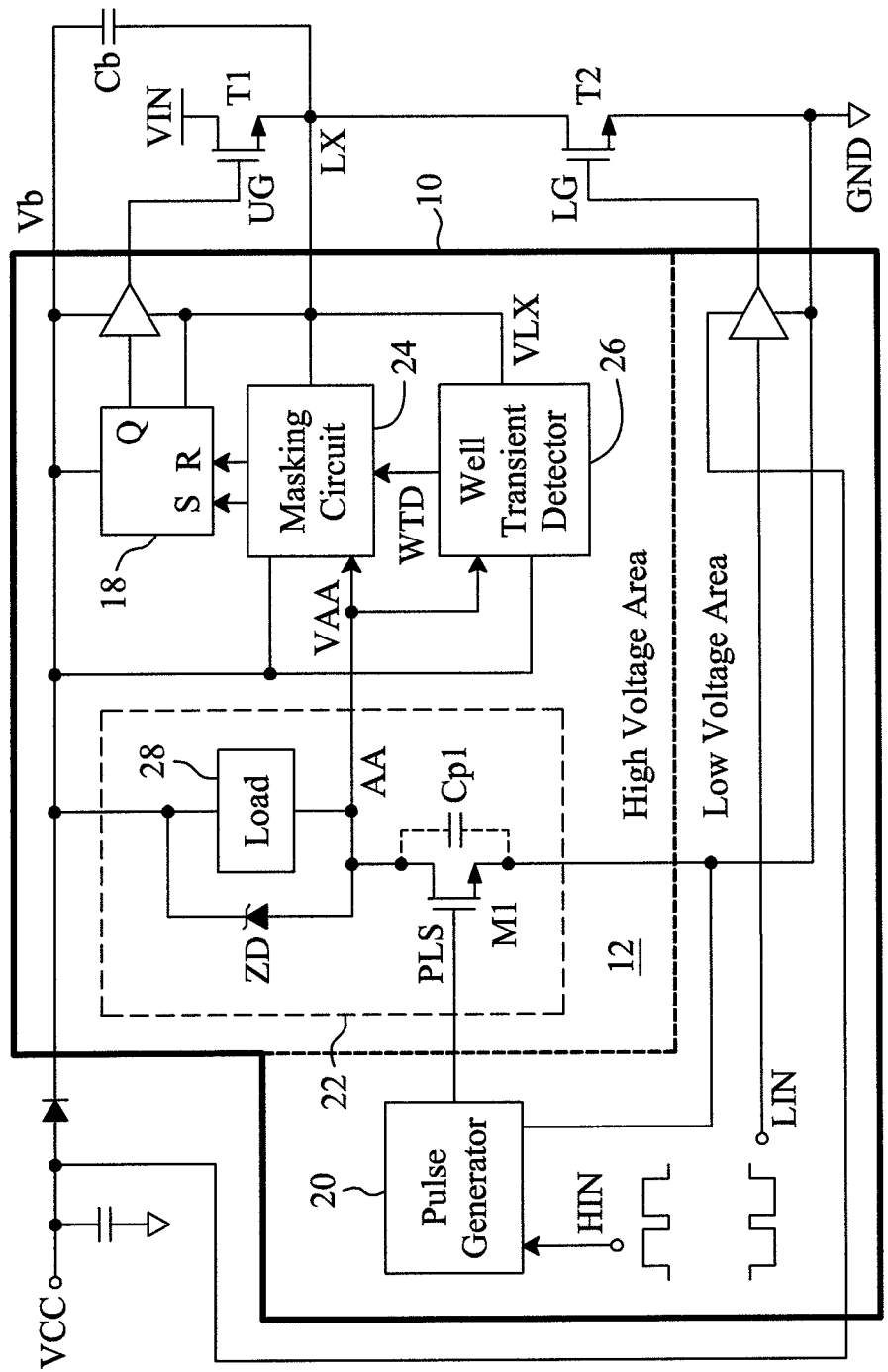
FIG. 2 is a circuit diagram of an embodiment according to the present invention.

Referring to the embodiment shown in FIG. 2, in addition to a power input terminal Vb, an ultra-high-voltage floating well 12, and an SR flip-flop 18 connected to the power input terminal Vb and the ultra-high-voltage floating well 12, as that shown in FIG. 1, a floating gate driver according to the present invention further includes a pulse generator 20, a single-end level shifter 22 connected to the power input terminal Vb and the pulse generator 20, a masking circuit 24 connected to the power input terminal Vb, the ultra-high-voltage floating well 12, and the single-end level shifter 22, and a well transient detector 26 connected to the power input terminal Vb, the ultra-high-voltage floating well 12, the single-end level shifter 22, and the masking circuit 24. The SR flip-flop 18, the single-end level shifter 22, the masking circuit 24, and the well transient detector 26 are formed in the ultra-high-voltage floating well 12. In order to shift the level of a switch signal HIN generated by a low-voltage logic circuit, the pulse generator 20 detects the rising edge and the falling edge of the switch signal HIN to generate a pulse signal PLS at a same output terminal, which includes the aforesaid short-pulse set signal Set and reset signal Reset, the single-end level shifter 22 translates the set signal Set and the reset signal Reset in the pulse signal PLS to a common output terminal AA, to represent the translated set signal Set and the translated reset signal Reset by the output voltage VAA, the well transient detector 26 detects the output voltage VAA to assert a well transient detect signal WTD, and under control of the well transient detect signal WTD, the masking circuit 24 masks noise in the output voltage VAA to apply the translated set signal Set and the reset signal Reset to the set input terminal S and the reset input terminal R of the SR flip-flop 18 to turn on and turn off a switch signal Q, respectively. Thus, the switch signal Q is a level-shifted version and has the same logic state of the switch signal HIN. In other embodiments, it is also feasible that the SR flip-flop 18 is replaced by any of other bistable circuits, for example, a D flip-flop or any of other latch devices. In the single-end level shifter 22, a load 28 and an input transistor M1 are connected in series between the power input terminal Vb and a ground terminal GND, the gate of the input transistor M1 receives the pulse signal PLS, each of whose pulses will turn on the input transistor M1 to cause the output voltage VAA to produce a negative pulse, and as a result, the rising edge of the switch signal HIN will trigger a negative-pulse set signal Set, and the falling edge of the switch signal HIN will trigger a negative-pulse reset signal Reset. The load 28 may use a resistor, a current source, a diode, or an element having a programmable impedance. Preferably, the single-end level shifter 22 further includes a Zener diode ZD connected in parallel to the load 28 to clamp the output voltage VAA, i.e., to prevent the output voltage VAA from falling below a certain clamp voltage Vclamp. The Zener diode ZD may be replaced by any of other clamping circuits in other embodiments.

Figure 3:
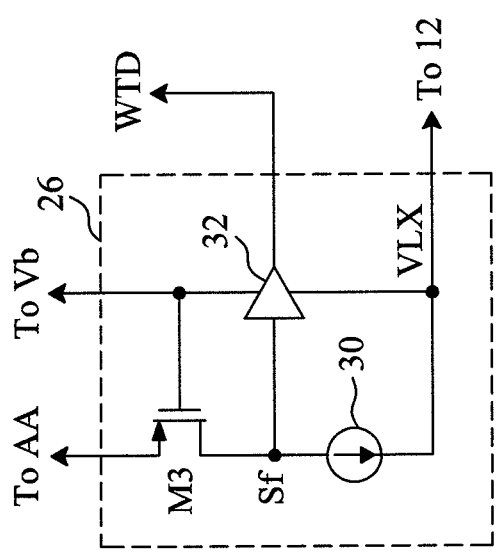
FIG. 3 is a circuit diagram of a first embodiment for the well transient detector shown in FIG. 2.

FIG. 3 is a circuit diagram of a first embodiment for the well transient detector 26 shown in FIG. 2, which is designed to detect noise generated when the voltage VLX drops down. In this embodiment, a transistor M3 and a current source 30 are connected in series between the common output terminal AA of the single-end level shifter 22 and the ultra-high-voltage floating well 12, the control terminal, i.e., the gate, of the transistor M3 is connected to the power input terminal Vb, and a buffer 32 has two bias input terminals connected to the power input terminal Vb and the ultra-high-voltage floating well 12, respectively, and determines the well transient detect signal WTD according to the signal at its signal input terminal, i.e., the drain voltage Sf of the transistor M3. In stable states, the transistor M3 is turned off and thus the voltage Sf is approximately equal to VLX and the output WTD of the buffer 32 is logic 0. When the voltage VLX suddenly fall below a threshold value, the voltage Vb will be pulled low, thereby turning on the transistor M3, causing the voltage Sf to rise instantaneously; as a result, the buffer 32 will trigger the well transient detect signal WTD.

Figure 4:
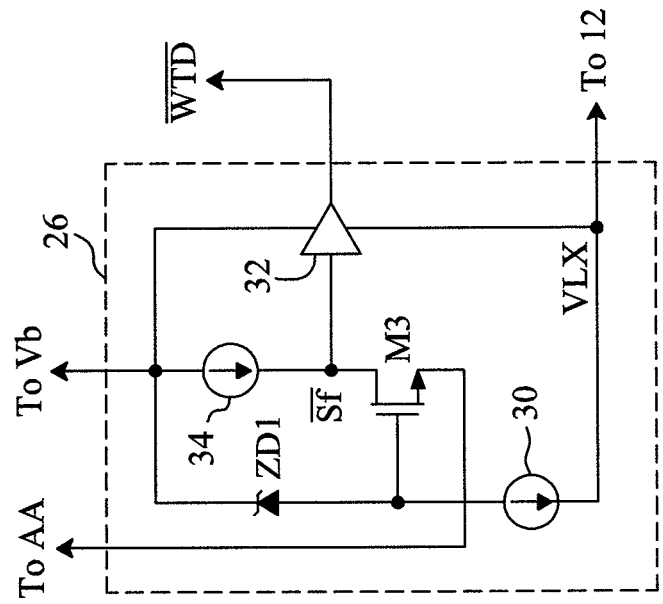
FIG. 4 is a circuit diagram of a second embodiment for the well transient detector shown in FIG. 2.

FIG. 4 is a circuit diagram of a second embodiment for the well transient detector 26 shown in FIG. 2, which is designed to detect noise generated when the voltage VLX rises. In this embodiment, a Zener diode ZD1 and a current source 30 are connected in series between the power input terminal Vb and the ultra-high-voltage floating well 12, a current source 34 and a transistor M3 are connected in series between the power input terminal Vb and the common output terminal AA of the single-end level shifter 22, and a buffer 32 has two bias input terminals connected to the power input terminal Vb and the ultra-high-voltage floating well 12, and determines the inverted signal $\overline{WTD}$, which is out of phase with the well transient detect signal WTD, according to the signal at its signal input terminal, i.e., the drain voltage $\overline{Sf}$ of the transistor M3. In stable states, the transistor M3 is turned off and thus the voltage $\overline{Sf}$ is approximately equal to Vb and the output $\overline{WTD}$ of the buffer 32 is logic 1, meaning the well transient detect signal WTD is logic 0. When the voltage VLX suddenly rise above a threshold value, the voltage Vb will be pulled high, thereby turning on the transistor M3, causing the voltage $\overline{Sf}$ to drop abruptly, turning the signal $\overline{WTD}$ into logic 0.

Figure 5:
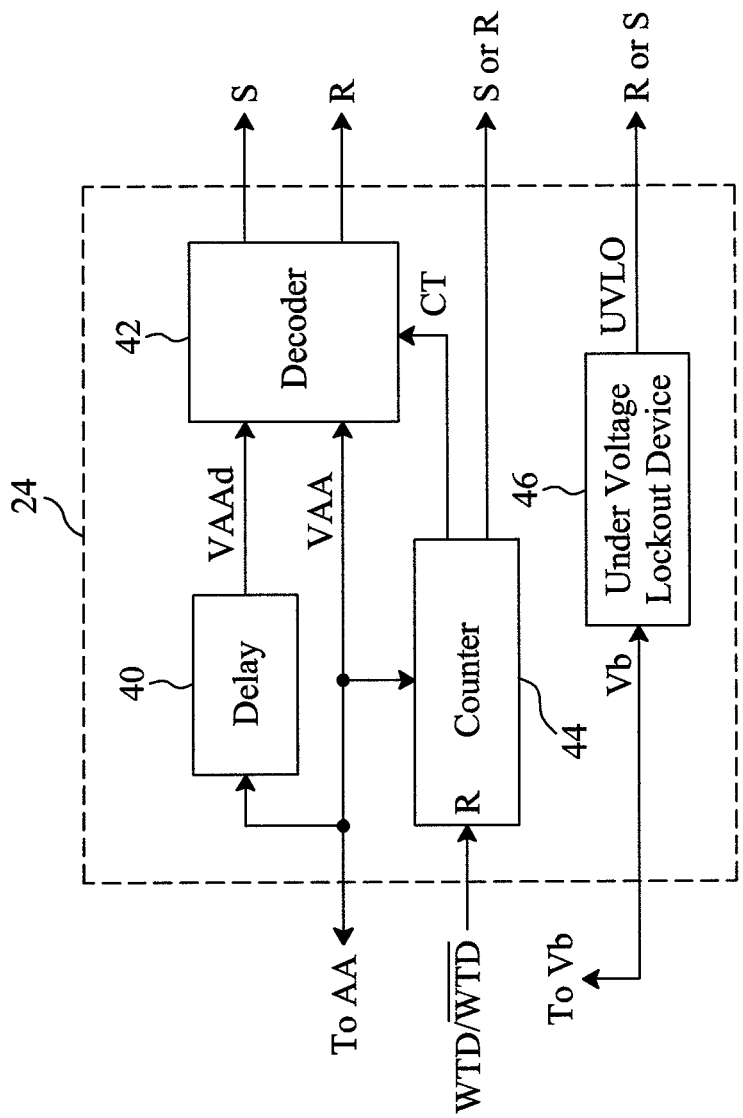
FIG. 5 is a circuit diagram of an embodiment for the masking circuit shown in FIG. 2.

FIG. 5 is a circuit diagram of an embodiment for the masking circuit 24 shown in FIG. 2, in which a delay unit 40 is connected to the common output AA of the single-end level shifter 22 to delay the output voltage VAA by a period of time $\Delta t$ to generate a delayed voltage VAAd, a decoder 42 is connected to the common output AA of the single-end level shifter 22 and the delay unit 40 to receive the output voltage VAA and the delayed voltage VAAd, a counter 44 is connected to the common output AA of the single-end level shifter 22 and the decoder 42 to count the number of pulses in the output voltage VAA of the single-end level shifter 22 to generate a count value CT for the decoder 42, and has a reset input terminal R connected to the well transient detector 26 such that the well transient detect signal WTD or its inversion $\overline{WTD}$ may reset the counter 44, and the decoder 42 performs a decoding process with the output voltage VAA and the delayed voltage VAAd to generate a set signal S and a reset signal R, and determines whether to release the set signal S and the reset signal R to the SR flip-flop 18 according to the count value CT. Preferably, the counter 44 also provides a set signal S or a reset signal R to the SR flip-flop 18. In an embodiment, once the count value CT reaches a preset value, the decoder 42 will release the first pulse in the voltage VAA as the set signal S after the delay time $\Delta t$ elapses, masks the second pulse in the voltage VAA, and releases the third pulse in the voltage VAA as the reset signal R. It is also feasible for the decoder 42 to provide additional protection so that the SR flip-flop 18 operates within a safe voltage range. For instance, the masking circuit 24 further includes an under voltage lockout device 46 for detecting the voltage Vb to generate an under voltage lockout signal UVLO as a set signal S or a reset signal R for the SR flip-flop 18, to turn off the high-side power transistor T1 when the voltage Vb becomes insufficient.

Figure 6:
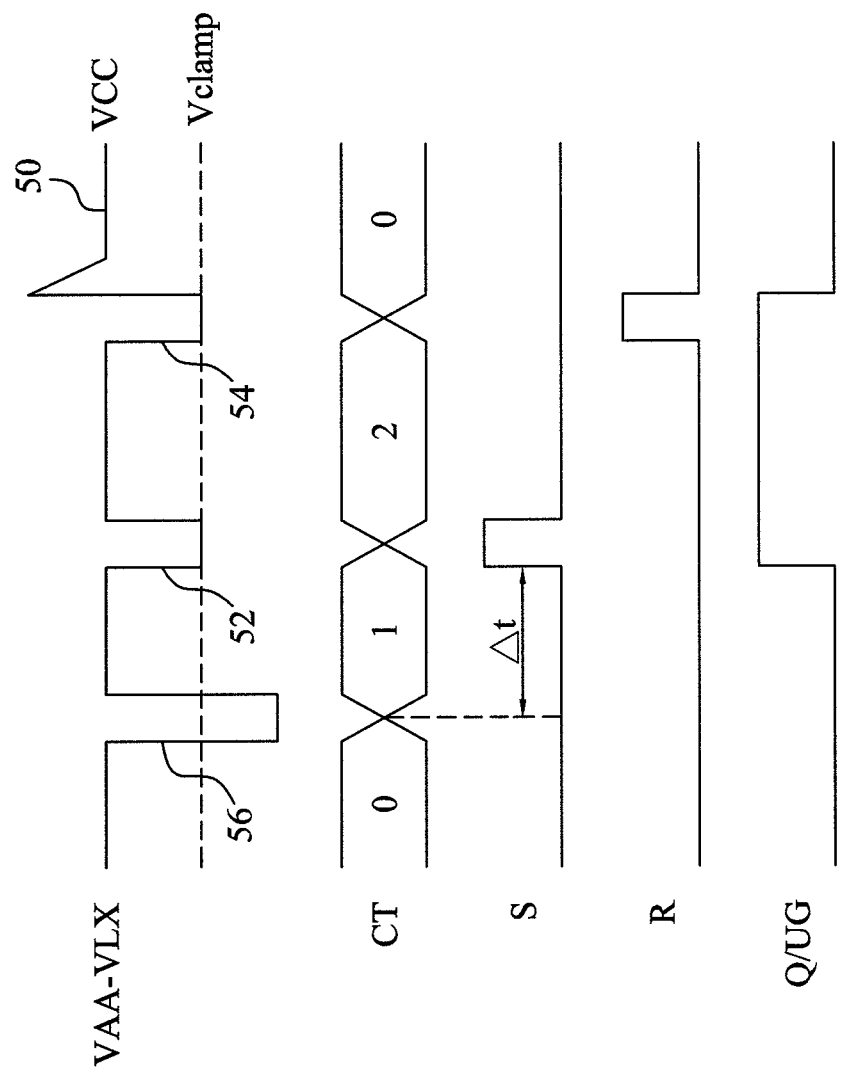
FIG. 6 is a timing diagram of the decoder shown in FIG. 5.

FIG. 6 is a timing diagram of the decoder 24 of FIG. 5 in an embodiment, in which the waveform 50 shows the output voltage VAA of the single-end level shifter 22 relative to the voltage VLX, the pulse 52 is caused by the set signal Set, the pulse 54 is caused by the reset signal Reset, and the pulse 56 is noise, whose level may be lower than the clamping voltage Vclamp, i.e., the limit set by the Zener diode ZD. When the counter 44 detects the first pulse 56, the count value CT becomes 1, and the decoder 42 does not release any signal. Only when the delay time Δt has elapsed will the decoder 42 release the second pulse 52 as the set signal S, and the following pulse 54 as the reset signal R.

Figure 7:
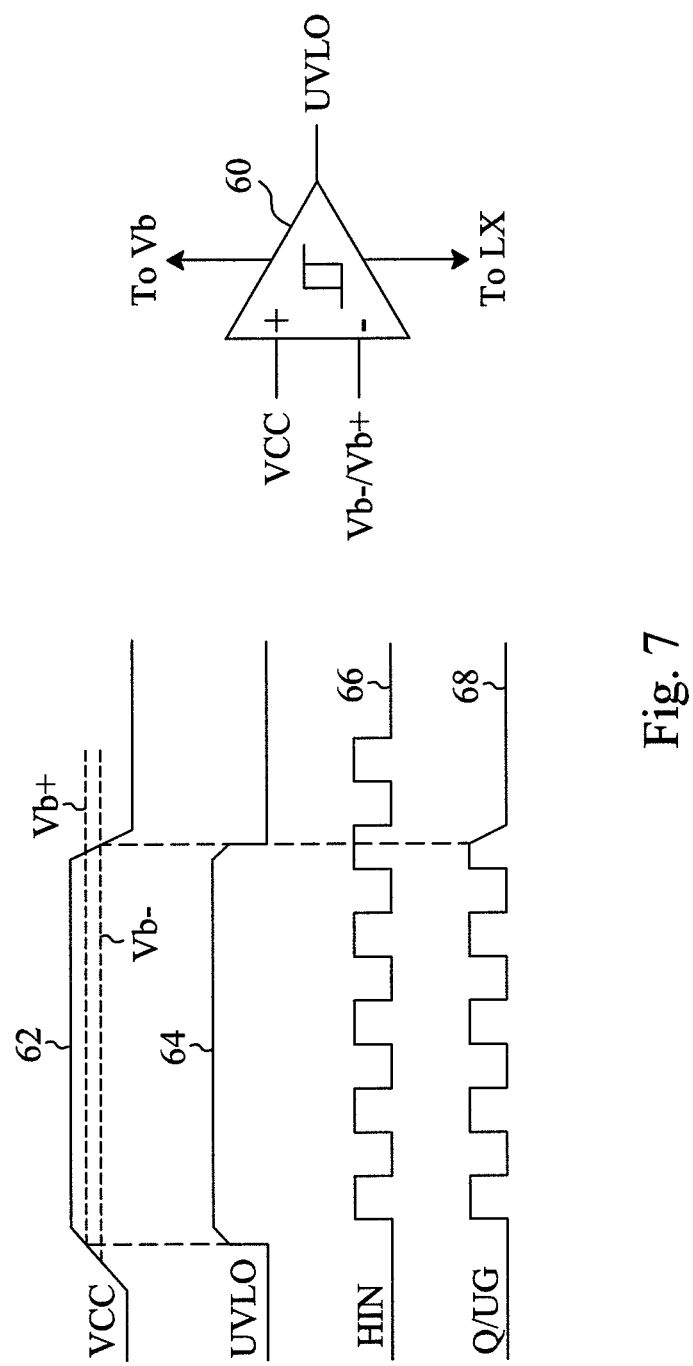
FIG. 7 is a circuit diagram of an embodiment for the under voltage lockout device shown in FIG. 5.

FIG. 7 shows an embodiment for the under voltage lockout device 46 shown in FIG. 5, in which a hysteresis comparator 60 detects the voltage Vb to generate the under voltage lockout signal UVLO. When the DC power supply VCC of the controller integrated circuit 10 is startup, the voltage Vb rises from zero to a maximum value, as shown by the waveform 62. Once the voltage Vb exceeds an upper boundary value Vb+, the under voltage lockout signal UVLO is turned to logic 1, as shown by the waveform 64. Thus, the SR flip-flop 18 is enabled and can respond to the switch signal HIN to generate the switch signal Q, as shown by the waveforms 66 and 68. When the DC power supply VCC of the controller IC 10 is shutdown, the voltage Vb falls from the maximum value to zero. Once the voltage Vb crosses over a lower boundary value Vb–, the under voltage lockout signal UVLO is turned to logic 0 and thereby disables the SR flip-flop 18. Consequently, the SR flip-flop 18 stops operating, and thus the switch signal Q will not be turned on, even though the switch signal HIN is not turned off, as shown by the waveforms 66 and 68. In other embodiments, the voltage Vb may be compared with a single boundary value Vb+ or Vb– instead in order to generate the under voltage lockout signal UVLO.

Figure 8:
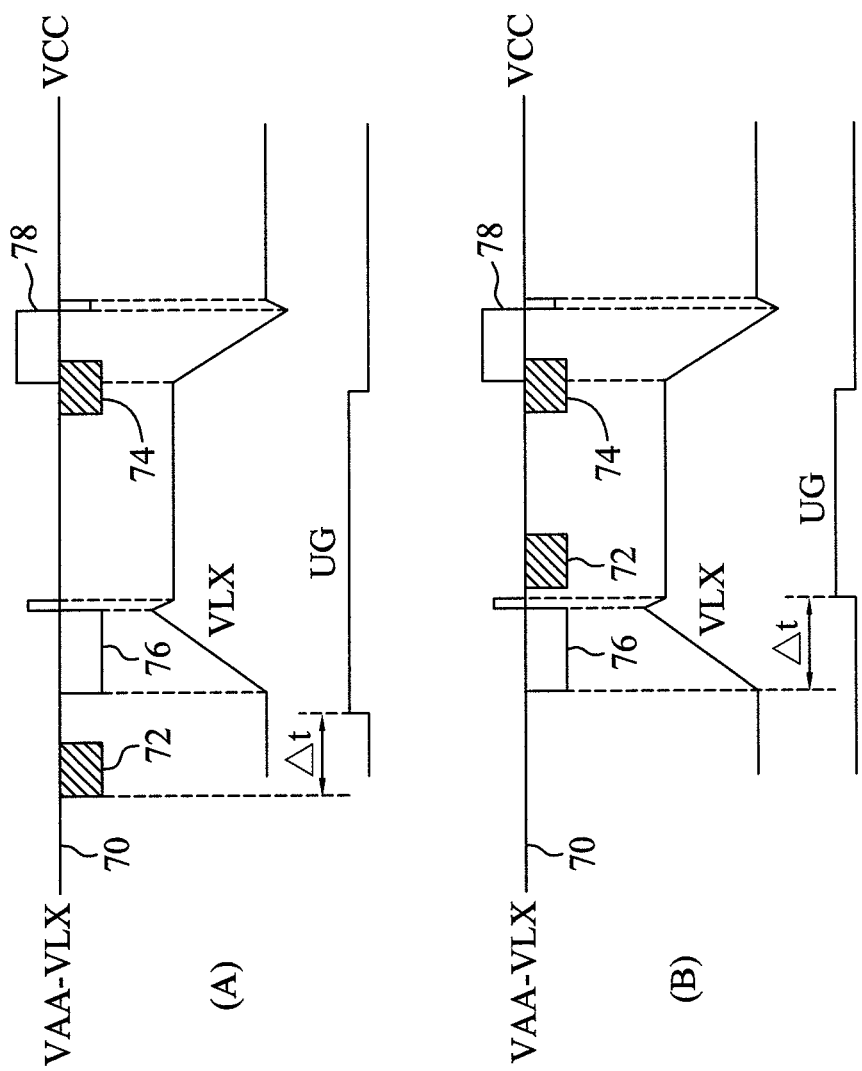
FIG. 8 is a diagram showing different applications of the circuit and the method according to the present invention.

FIG. 8 is a diagram showing different applications of the circuit and the method according to the present invention. In non-zero voltage switching applications as shown in FIG. 8(A), the pulse 72 is caused by the set signal Set, and the pulse 74 is caused by the reset signal Reset. Once the pulse 72 is detected, UG will not be turned on until the time Δt elapses. Turn-on of the high-side power transistor T1 causes transient variation of the voltage VLX, thereby generating noise 76. When the high-side power transistor T1 is turned off, another transient variation of the voltage VLX takes place and generates noise 78. In this operation mode, the noise 76 is masked after detection of the pulse 72, and then the pulse 74 is released. In zero voltage switching applications as shown in FIG. 8(B), noise 76 occurs before the pulse 72. Once the noise 76 is detected, UG will be turned on after the time Δt elapses, and the pulse 74 is released afterward.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A circuit for improving noise immunity of a single-end level shifter in a floating gate driver having the single-end level shifter to translate a set signal and a reset signal to a common output terminal of the single-end level shifter to provide an output voltage to control a bistable circuit in reference to a voltage of an ultra-high-voltage floating well to generate a switch signal, the circuit comprising:
    a well transient detector connected to the common output terminal, a power input terminal of the floating gate driver, and the ultra-high-voltage floating well, detecting the output voltage to assert a well transient detect signal; and
    a masking circuit connected to the common output terminal, the power input terminal, and the well transient detector, masking noise in the output voltage under control of the well transient detect signal, to apply a translated set signal and a translated reset signal to the bistable circuit for turning on and turning off the switch signal, respectively.

2. The circuit of claim 1, wherein the well transient detector comprises:
    a transistor and a current source connected in series between the common output terminal and the ultra-high-voltage floating well, the transistor having a control terminal connected to the power input terminal; and
    a buffer having a signal input terminal connected to an output terminal of the transistor, and two bias input terminals connected to the power input terminal and the ultra-high-voltage floating well, respectively, determining the well transient detect signal according to a voltage at the output terminal of the transistor.

3. The circuit of claim 1, wherein the masking circuit comprises:
    a delay unit connected to the common output terminal, delaying the output voltage by a period of time;
    a counter connected to the common output terminal and the well transient detector, counting a number of pulses in the output voltage to generate a count value, the counter having a reset input terminal to receive the well transient detect signal; and
    a decoder connected to the common output terminal, the delay unit, and the counter, performing a decoding process with the output voltage and the delayed output voltage to generate the translated set signal and the translated reset signal, and determining whether to release the translated set signal and the translated reset signal according to the count value.

4. The circuit of claim 3, wherein the counter provides a signal for resetting the bistable circuit.

5. The circuit of claim 3, wherein the masking circuit further comprises an under voltage lockout device connected to the power input terminal, detecting a voltage at the power input terminal to reset the bistable circuit.

6. A method for improving noise immunity of a single-end level shifter in a floating gate driver having the single-end level shifter to translate a set signal and a reset signal to a common output terminal of the single-end level shifter to provide an output voltage to control a bistable circuit in reference to a voltage of an ultra-high-voltage floating well to generate a switch signal, the method comprising:
    A.) detecting the output voltage to assert a well transient detect signal; and
    B.) masking noise in the output voltage under control of the well transient detect signal, to apply a translated set signal and a translated reset signal to the bistable circuit for turning on and turning off the switch signal, respectively.

7. The method of claim 6, wherein the step A comprises triggering the well transient detect signal when the voltage of the ultra-high-voltage floating well suddenly falls below a threshold value.

8. The method of claim 6, wherein the step B comprises:
    counting a number of pulses in the output voltage after the well transient detect signal is triggered, to generate a count value; and releasing the translated set signal to the bistable circuit when a time departing from a first pulse in the output voltage reaches a preset value.

9. The method of claim 8, wherein the step B further comprises releasing the translated reset signal to the bistable circuit when the count value reaches a preset value.

10. The method of claim 6, wherein the step B comprises:
counting a number of pulses in the output voltage after the well transient detect signal is triggered, to generate a count value; and
masking pulses in the output voltage for a period of time when the count value reaches a preset value.

11. A floating gate driver comprising:
a power input terminal;
an ultra-high-voltage floating well;
a pulse generator detecting a rising edge and a falling edge of a first switch signal to trigger a set signal and a reset signal, respectively, into a pulse signal;
a single-end level shifter connected to the power input terminal and the pulse generator, translating the set signal and the reset signal to a common output terminal to provide an output voltage;
a bistable circuit connected to the power input terminal and the ultra-high-voltage floating well, generating a second switch signal with a voltage of the ultra-high-voltage floating well as a reference potential;
a well transient detector connected to the power input terminal, the ultra-high-voltage floating well, and the common output terminal, detecting the output voltage to assert a well transient detect signal; and
a masking circuit connected to the power input terminal, the ultra-high-voltage floating well, the common output terminal, and the well transient detector, masking noise in the output voltage under control of the well transient detect signal, to apply a translated set signal and a translated reset signal to the bistable circuit for turning on and turning off the second switch signal, respectively.

12. The floating gate driver of claim 11, further comprising a bootstrap capacitor connected between the power input terminal and the ultra-high-voltage floating well.

13. The floating gate driver of claim 11, wherein the single-end level shifter comprises:
an input transistor having a control terminal connected to the pulse generator for transmitting the set signal and the reset signal to the common output terminal; and
a load connected between the power input terminal and the common output terminal for generating the output voltage responsive to either the set signal or the reset signal.

14. The floating gate driver of claim 13, wherein the input transistor is in the ultra-high-voltage floating well.

15. The floating gate driver of claim 13, further comprising a clamping circuit connected in parallel to the load.

16. The floating gate driver of claim 11, wherein the bistable circuit comprises a flip-flop controlled by the translated set signal and the translated reset signal.

17. The floating gate driver of claim 11, wherein the well transient detector comprises:
a transistor and a current source connected in series between the common output terminal and the ultra-high-voltage floating well, the transistor having a control terminal connected to the power input terminal; and
a buffer having a signal input terminal connected to an output terminal of the transistor, and two bias input terminals connected to the power input terminal and the ultra-high-voltage floating well, respectively, determining the well transient detect signal according to a voltage at the output terminal of the transistor.

18. The floating gate driver of claim 11, wherein the masking circuit comprises:
a delay unit connected to the common output terminal, delaying the output voltage by a period of time;
a counter connected to the common output terminal and the well transient detector, counting a number of pulses in the output voltage to generate a count value, the counter having a reset input terminal to receive the well transient detect signal; and
a decoder connected to the common output terminal, the delay unit, and the counter, performing a decoding process with the output voltage and the delayed output voltage to generate the translated set signal and the translated reset signal, and determining whether to release the translated set signal and the translated reset signal according to the count value.

19. The floating gate driver of claim 18, wherein the counter provides a signal for resetting the bistable circuit.

20. The floating gate driver of claim 18, wherein the masking circuit further comprises an under voltage lockout device connected to the power input terminal, detecting a voltage at the power input terminal to reset the bistable circuit.

* * * * *